US012580554B2

(12) United States Patent
Feng et al.

(10) Patent No.: US 12,580,554 B2
(45) Date of Patent: Mar. 17, 2026

(54) VARIATION COMPENSATION OF POWER SEMICONDUCTORS

(71) Applicant: Kabushiki Kaisha Toshiba, Tokyo (JP)

(72) Inventors: Zhengyang Feng, Bristol (GB); Kohei Onizuka, Tokyo (JP); Manish Kumar, Bristol (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 19 days.

(21) Appl. No.: 18/601,422

(22) Filed: Mar. 11, 2024

(65) Prior Publication Data

US 2025/0286536 A1 Sep. 11, 2025

(51) Int. Cl.
*H03K 3/011* (2006.01)
(52) U.S. Cl.
CPC .................................... *H03K 3/011* (2013.01)
(58) Field of Classification Search
CPC ........... H02M 3/33515; H02M 1/0012; H02M 3/157; H02M 7/003; H02M 1/0009; H02M 1/08; H02M 1/0003
See application file for complete search history.

(56) References Cited

U.S. PATENT DOCUMENTS 6,147,848 A * 11/2000 Boggs ................... H02M 3/157
  323/283
7,245,116 B2 * 7/2007 Tateno ................ H02M 3/1588
  323/314

OTHER PUBLICATIONS

Dymond et al., "A 6.7-GHz Active Gate Driver for GaN FETs to Combat Overshoot, Ringing, and EMI", IEEE Transactions on Power Electronics, vol. 33, No. 1, Jan. 2018, 14 pages, DOI: 10.1109/TPEL.2017.2669879.
Shorten et al., "A Segmented Gate Driver IC for the Reduction of IGBT Collector Current Over-Shoot at Turn-on", Proceedings of The 25th International Symposium on Power Semiconductor Devices & ICs, IEEE, 2013, 4 pages, DOI: 10.1109/ISPSD.2013.6694400.
Raviola et al., "A Critical Assessment of Open-Loop Active Gate Drivers Under Variable Operating Conditions", 2021 IEEE International Joint EMC/SI/PI and EMC Europe Symposium, 2021, 6 pages, DOI: 10.1109/EMC/SI/PI/EMCEurope52599.2021.9559173.

(Continued)

*Primary Examiner* — Diana J. Cheng
(74) *Attorney, Agent, or Firm* — Oblon, McClelland, Maier & Neustadt, L.L.P.

(57) ABSTRACT

A method of generating driving patterns for an active gate driver, AGD, the method comprising controlling a power semiconductor, at a plurality of operating conditions, with the AGD. For each operating condition, one or more electrical signals of the power semiconductor are obtained, a variation in one or more key parameters of the power semiconductor is detected from the one or more electrical signals, and a driving pattern, corresponding to the variation in the one or more key parameters, is generated based on a pre-determined relationship between the variation in the one or more the key parameters and one or more driving parameters of the driving pattern. The generated driving patterns for each operating condition, and the corresponding variation in the one or more key parameters, are stored in a memory.

19 Claims, 6 Drawing Sheets

(56) References Cited

OTHER PUBLICATIONS

Raviola et al., "An Adaptive Method to Reduce Undershoots and Overshoots in Power Switching Transistors Through a Low-Complexity Active Gate Driver", IEEE Transactions on Power Electronics, vol. 38, No. 3, Mar. 2023, 11 pages, DOI:10.1109/TPEL.2022.3221187.

Cheng et al., "High-Speed Searching of Optimum Switching Pattern for Digital Active Gate Drive to Adapt to Various Load Conditions", IEEE Transactions on Industrial Electronics, vol. 69, No. 5, May 2022, 10 pages, DOI: 10.1109/TIE.2021.3084169.

Ling et al., "A Self-Regulating Gate Driver for High-Power IGBTs", IEEE Transactions on Power Electronics, vol. 36, No. 3, Mar. 2021, 12 pages, DOI: 10.1109/TPEL.2020.3015924.

* cited by examiner

VARIATION COMPENSATION OF POWER SEMICONDUCTORS

FIELD OF THE INVENTION

The invention relates to the field of active gate drive (AGD) and power semiconductor. In particular, the invention relates to methods and systems for generating driving patterns from active gate drive that can compensate the variations of power semiconductor driven by active gate driver.

BACKGROUND

Power semiconductors are electronics devices that are widely used in many industrial applications, such as renewable energy system and electrical vehicles. In order to use power semiconductors in practice, a gate driver is used to provide the required voltage and current level to switch the power semiconductor on and off quickly, efficiently, and safely.

However, power semiconductors are susceptible to variations of key parameters that affect their switching performance and bring reliability issues in applied systems. These variations of the power semiconductors include, but are not limited to, the threshold voltage, the transconductance, parasitic capacitances and the gate resistance.

The causes of these variations include changes in physical properties due to manufacturing and processing, and changes in operating voltages and temperatures. Compensating for said variations and guaranteeing the reliability of the power semiconductors is important for the commercialisation and industrial applicability of power semiconductors systems.

Thus, there is a need to improve the switching performance of power semiconductors when such variations occur.

BRIEF DESCRIPTION OF THE FIGURES

Reference is made, by the way of example only, to the accompanying figures, in which.

DETAILED DESCRIPTION

Figure 1:
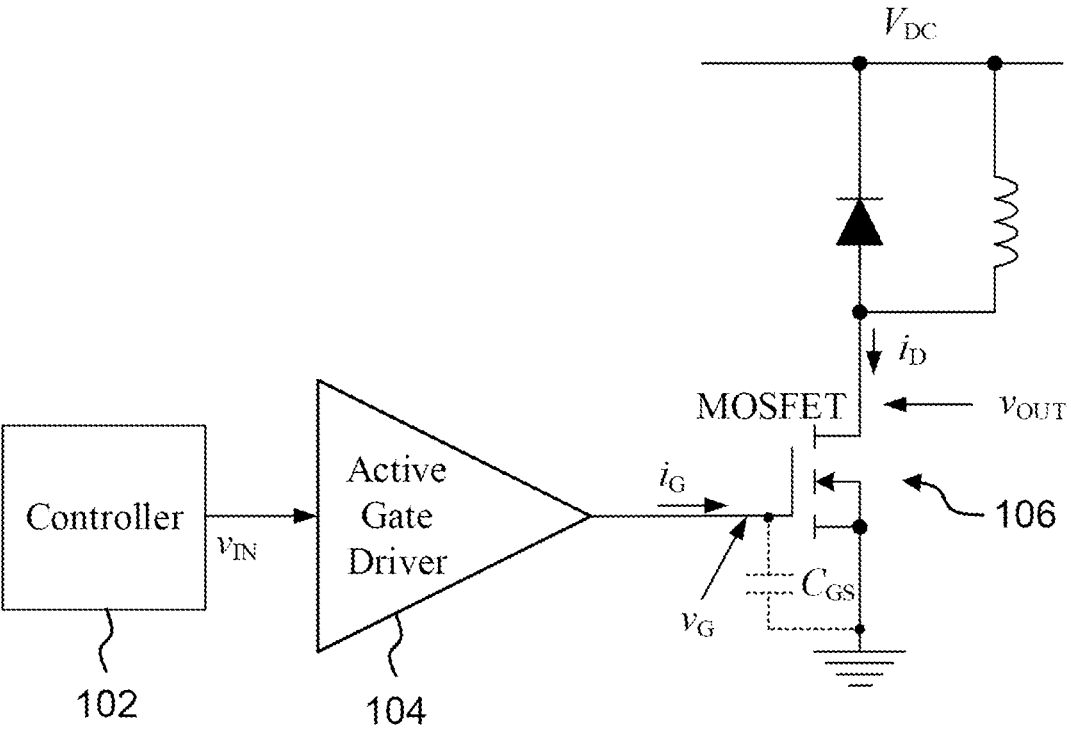
FIG. 1 shows a basic structure of an open loop active gate driver.

According to an embodiment there is provided a method of generating driving patterns for an active gate driver, AGD, the method comprising controlling a power semiconductor, at a plurality of operating conditions, with the AGD. For each operating condition, one or more electrical signals of the power semiconductor are obtained, a variation in one or more key parameters of the power semiconductor is detected from the one or more electrical signals, and a driving pattern, corresponding to the variation in the one or more key parameters, is generated based on a pre-determined relationship between the variation in the one or more the key parameters and one or more driving parameters of the driving pattern. The generated driving patterns for each operating condition, and the corresponding variation in the one or more key parameters, are stored in a memory At different operating conditions, carrier mobility may change in the power semiconductor. This changes the way in which the power semiconductor operates. However, measuring the changes on the power semiconductor caused by differences in operating conditions is often not feasible during use. These changes often result in variations in key parameters (e.g., electrical characteristics) of the power semiconductor. However, it is also often impractical to directly measure the key parameters of a power semiconductor during use. Instead, electrical signals from the power semiconductor (e.g., voltage, current etc.) can be used to detect the variations in the key parameters of the power semiconductor. As such, the electrical signals act as variation indices for the variations in the key parameters.

By storing driving patterns for the variation(s) in the key parameters, they can later be used by a device comprising the AGD to select the most appropriate driving pattern when a variation in the key parameters is detected, or slightly tune the selected driving patterns if necessary. This results in much lower computational resources when compared to having to derive a new driving pattern from scratch. As such, the storing of the driving patterns enables the device to improve its operation, by generating the most appropriate driving patterns, without requiring the use of a complex controller/computer. This enables driving patterns to be generated for different key parameters of the power semiconductor which may arise from variations in the power semiconductor caused by the different operating conditions. Thus, appropriate driving patterns can be used for the corresponding variation in the key parameter(s).

A driving pattern comprises a plurality of steps. A driving pattern can be defined by driving parameters including, for example, a gate voltage, a gate current and a timing (i.e., time period) for each step in the driving pattern.

The different operating conditions may comprise, for example, changes in operating voltage and/or changes in operating temperature.

The pre-determined relationship can be derived from, for example, data included in the datasheet of the power semiconductor.

The one or more key parameters of the power semiconductor may be one or more electrical characteristics of the power semiconductor.

The AGD may be driven with a reference driving pattern.

The method may be computer-implemented.

The method may further comprise, for each operating condition, determining a number of driving parameters of the generated driving pattern which differ from the corresponding driving parameters of a reference driving pattern and determining whether the number of driving parameters which differ from the corresponding driving parameters of the reference driving pattern is larger than a threshold number, wherein a driving pattern of the generated driving patterns is stored only if the number of driving parameters of the driving pattern which differ from the corresponding driving parameters of the reference driving pattern is larger than the threshold number.

The threshold number may be, for example, 1, 2, 3 or 4.

One of the key parameters may include a turn-on delay time, wherein generating the driving pattern may comprise adapting one or more step timings of a reference driving pattern to generate the driving pattern.

The electrical signals may comprise a gate voltage waveform and a drain current waveform, wherein the turn-on delay time is the time between when the AGD starts to output voltage and the time when the drain current starts to flow.

The pre-determined relationship between the variation in the one or more the turn-on delay and the one or more driving parameters of the driving pattern may indicate that a timing of a step of the driving pattern increases when the turn-on delay increases, and said timing decreases when the first turn-on delay decreases. The amount by which the timing increases/decreases can be derived from, for example, theoretical analysis of the particular model of power semiconductor used. Often, the datasheet of the power semiconductor contains information which can be used to derive said increases/decreases. The timing of the step may be the first timing of the first step.

A variation in the threshold voltage may also be derived from the turn-on delay time (e.g., using theoretical analysis, relationships provided in the datasheet and/or machine learning).

The plurality of operating conditions may comprise a plurality of operating voltages and/or a plurality of operating temperatures.

Herein is also provided a method of generating driving patterns for an active gate driver, AGD, the method comprising: controlling a plurality of power semiconductors of the same model with the AGD; for each power semiconductor: obtaining one or more electrical signals of the power semiconductor; detecting a variation in one or more in key parameters of the power semiconductor from the one or more electrical signals; and generating a driving pattern, corresponding to the variation in the one or more key parameters, based on a pre-determined relationship between the variation in the one or more key parameters and one or more driving parameters of the driving pattern. The method further comprises storing the generated driving patterns for each power semiconductor and the corresponding variation in the one or more key parameters in a memory.

Different power semiconductors of the same model will often have somewhat different physical properties due to, for example, the manufacturing tolerances. These differences can cause variations in key parameters of the power semiconductors of the same model.

The method may be computer-implemented.

The method may further comprise, for each power semiconductor, determining a number of driving parameters of the generated driving pattern which differ from the corresponding driving parameters of a reference driving pattern, and determining whether the number of driving parameters which differ from the corresponding driving parameters of the reference driving pattern is larger than a threshold number, wherein a driving pattern of the generated driving patterns is stored only if the number of driving parameters of the driving pattern which differ from the corresponding driving parameters of the reference driving pattern is larger than the threshold number.

One of the one or more key parameters may include a turn-on delay time, wherein generating the driving pattern may comprise adapting one or more step timings of a reference driving pattern to generate the driving pattern.

The electrical signals may comprise a gate voltage waveform and a drain current waveform, wherein the turn-on delay time is the time between when the AGD starts to output voltage and the time when the drain current starts to flow.

Herein is also provided a method for controlling an active gate driver, AGD, the method comprising: controlling a power semiconductor with the AGD using a first driving pattern, from a plurality of pre-determined driving patterns, wherein each pre-determined driving pattern corresponds to variations in one or more key parameters of the power semiconductor; obtaining one or more electrical signals of the power semiconductor; detecting a variation of one or more key parameters of the power semiconductor based on the electrical signals; selecting a second driving pattern, from the plurality of pre-determined driving patterns, corresponding to the variation in the one or more key parameters; and controlling the power semiconductor with the AGD using the second driving parameter.

This enables a corresponding driving pattern to be selected based on any detected variations in the key parameters (e.g., turn-on delay time). As such, the sensing requirements during use can be reduced and the computational resources needed can also be reduced, thus reducing the amount and complexity of the components which are needed in order to obtain an appropriate driving pattern.

The method may be computer-implemented.

The method may further comprise determining a number of driving parameters of the first driving pattern to be adapted based on the variation in the one or more key parameters, wherein selecting the second drive pattern from the plurality of pre-determined driving patterns is based on said number of driving parameters being above a threshold number, and wherein the method further comprises, based on said number of driving parameters being below, or equal to, the threshold number, adapting the first driving pattern based on the variation in the one or more key parameters to generate a second driving pattern.

Adapting the first driving pattern may be based on a known predetermined relationship between the variation in the one or more the key parameters and the one or more driving parameters of the driving pattern.

One of the one or more key parameters may include a turn-on delay time.

The electrical signals may comprise a gate voltage waveform and a drain current waveform, wherein the turn-on delay time is the time between when the AGD starts to output voltage and the time when the drain current starts to flow.

The method may further comprise obtaining the plurality of driving patterns according to any of the afore-mentioned methods used to generate driving patterns.

Herein is also provided a computer program comprising computer program code which, when executed on a processing device, causes the processing device to perform all the steps of any of the afore-mentioned methods.

Herein is also provided a system for generating driving patterns for an active gate driver, AGD, the system comprising: an AGD; a power semiconductor; a memory; and a controller configured to: control the power semiconductor, at a plurality of operating conditions, with the AGD; for each operating condition: obtain one or more electrical signals of the power semiconductor; detect a variation in one or more key parameters of the power semiconductor from the one or more electrical signals; and generate a driving pattern, corresponding to the variation of the one or more key parameters, based on a pre-determined relationship between the variation of the one or more key parameters and one or more driving parameters of the driving pattern; and store the generated driving patterns for each operating condition and the corresponding variation in the one or more key parameters in the memory.

Herein is also provided a system for generating driving patterns for an active gate driver, AGD, the system comprising: an AGD; a plurality of power semiconductors; a memory; and a controller configured to: control a plurality of power semiconductors of the same model with the AGD; for each power semiconductor: obtain one or more electrical signals of the power semiconductor; detect a variation in one or more key parameters of the power semiconductor from the one or more electrical signals; and generate a driving pattern, corresponding to the variation in the one or more key parameters, based on a pre-determined relationship between the variation in the one or more key parameters and one or more driving parameters of the driving pattern; and store the generated driving patterns for each power semiconductor and the corresponding variation in the one or more key parameter in the memory.

Herein is also provided a system for controlling an active gate driver, AGD, the system comprising: an AGD; a power semiconductor; a memory storing a plurality of pre-determined driving patterns, wherein each pre-determined driving pattern corresponds to a variation in one or more key parameters of the power semiconductor; and a controller configured to: control the power semiconductor with the AGD using a first driving pattern, from the plurality of pre-determined driving patterns; obtain electrical signals of the power semiconductor; detect a variation in one or more key parameters of the power semiconductor based on the electrical signals; select a second driving pattern, from the plurality of pre-determined driving patterns, corresponding to the variation in the one or more key parameters; and control the power semiconductor with the AGD using the second driving parameter.

Herein is provided an active gate driver (AGD) for compensating the variations of a power semiconductor (e.g., MOSFET, IGBT etc.), wherein said power semiconductor is driven by said AGD through its gate terminal. The power semiconductor may be a transistor.

Herein is also provided an algorithm for generating driving patterns to a plurality of power semiconductors. A set of predetermined compensating rules is developed and used to generate driving patterns.

The algorithm may further comprise generating driving patterns that improve the switching performance and provide a trade-off between the overshoot voltage/current and switching losses of the power semiconductor.

The configuration of the AGD and the generation of the driving patterns may occur during factory testing, prior to shipment to a customer.

Predetermined compensating rules in the algorithm can be extracted manually or using a machine learning method.

A lookup table (LUT) of the active gate driver may store the driving patterns and said LUT may stay the same for the same model of power semiconductor through development to in-use operation.

Herein is also provided a computer-implemented method for configuring the AGD with driving patterns that can compensate the variations of any model of power semiconductor, comprising receiving input data from the power semiconductor during its switching transient by the AGD, transferring the input data from the AGD to a computer, applying a set of predetermined compensating rules to the input data and generate driving patterns for the power semiconductor, storing the driving patterns in the AGD and, optionally, driving the power semiconductor with the AGD using the driving patterns.

Herein is also provided a controller-implemented system for compensating the variation of any model of power semiconductor in real operation, the method comprising receiving input data from the power semiconductor during its switching transient to the AGD, transferring the data from the AGD to a controller, selecting driving patterns previously stored in the AGD and tuning the selected driving patterns if necessary. The selected or further tuned driving pattern is driving said power semiconductor.

The selection from the LUT may be further dependent on the operating conditions of the power semiconductor, including the current passing through or the voltage across.

An AGD may comprise an analogue to digital converter, a lookup table and/or an isolation between an input and an output.

An AGD may be an integrated IC or a dedicated circuit using discrete components.

An AGD may further comprise the ability of outputting multi-step gate driving patterns with variable magnitudes.

Variations of power semiconductor may comprise the variations of key parameters affecting the switching performance of power semiconductor, such as the threshold voltage, the transconductance, parasitic capacitance between the gate and source, parasitic capacitance between the gate and drain parasitic capacitance between the drain and source and/or the gate resistance.

Input data from the power semiconductor may be an index for variation detection rather than the whole switching waveforms during the switching transient.

The controller may be a microcontroller, digital signal processing (DSP) controller, field programmable gate array (FPGA) or any other type.

Provided herein is an AGD equipped with an algorithm to compensate for variations while ensuring appropriate switching performance of power semiconductors. By compensating for the variations, the AGD can be applied for a wider range of devices under wider operating scenarios, while also ensuring appropriate switching performance.

Compared to conventional gate drivers, AGDs use shaped waveforms to drive the power semiconductor. AGDs are used for various types of power semiconductor as they provide a better trade-off between voltage/current overshoot and switching losses compared to other approaches, such as the adjusting gate resistance and insertion of snubbers. Thus AGDs offer improved efficiency and electromagnetic compatibility performance in systems.

FIG. 1 shows a basic structure of an open loop AGD where the AGD 104 sits between the controller 102 and the driven power semiconductor, in this case a metal-oxide-semiconductor field-effect transistor (MOSFET) 106. There is no feedback from the driven MOSFET 106.

In the open loop AGD, the driving patterns are fixed and found a priori, which means the AGD 104 cannot take into consideration the variations of the MOSFET 106. For example, the threshold voltage depends on the thickness of the epitaxial layer, the channel length and the concentration of interface traps in the MOSFET 106. For a particular MOSFET type, said physical variations between different MOSFETs of the same type can result in 0.7-V variations for the threshold voltage. There is also a spread in internal gate resistances and the parasitic capacitances for different MOSFETs of the same type. In this case, an open loop AGD may be appropriate for one scenario but no longer be appropriate for another when said variations occur.

Moreover, key parameters of the MOSFET 106 are temperature dependent, which means they are susceptible to changes in operating temperature. Thus, the switching performance of the MOSFET 106 can change when the operating conditions (e.g., temperature) are different than the operating conditions assumed during the generation of the driving pattern being used. Thus, a driving pattern developed for a specific set of operating conditions may no longer be suitable when used to switch a power semiconductor (e.g., the MOSFET 106) operating under different operating conditions.

As a step forward from open loop AGDs, closed loop AGDs, can be used to account for the variations and different operating conditions of driven power semiconductors. There are different ways to provide the feedback signal for close loop.

Figure 2:
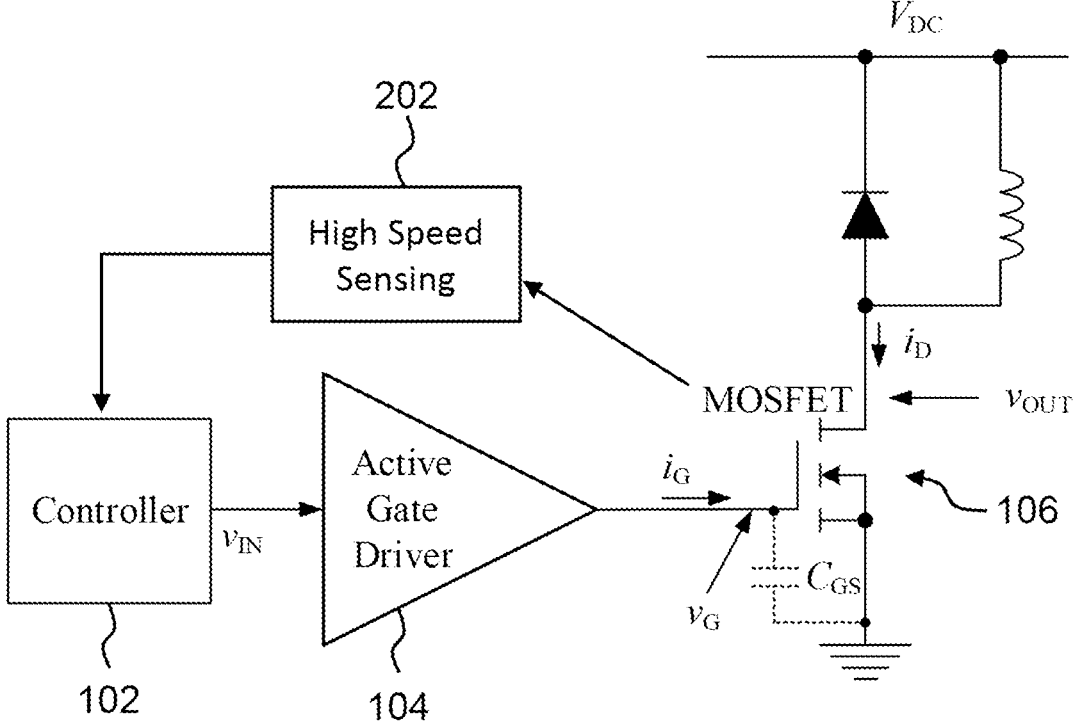
FIG. 2 shows a closed loop active gate driver using high speed sensing.

FIG. 2 shows a closed loop AGD using high speed sensing 202 on a MOSFET 106. This is based on the change over time of the drain current di/dt, and the change over time of the drain-source voltage dv/dt. However, as transients are becoming faster, the requirements for implementing such sensing (i.e., sensing circuits, analogue to digital converters ADC etc.) in the AGD need to be faster as well. This high requirement on the sensing proves to be difficult in real operation since the switching frequency of power semiconductors is usually above kHz.

Alternatively, oscilloscopes could be used to measure variations in the electrical signals from within the MOSFET 106.

Figure 3:
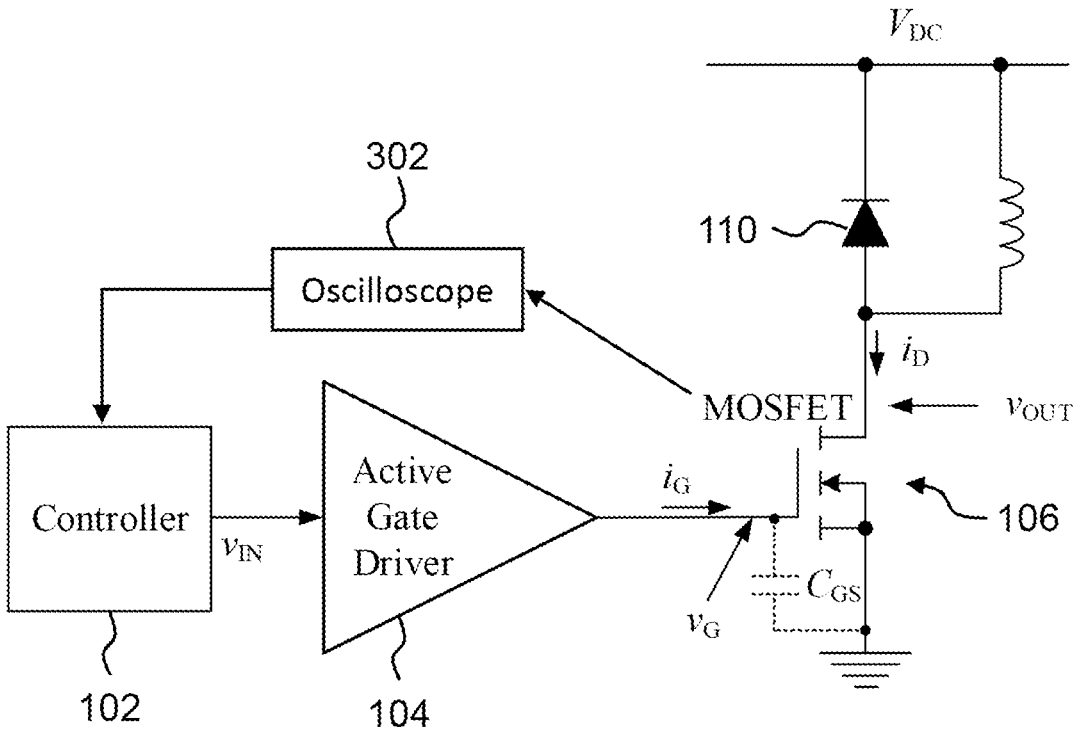
FIG. 3 shows a closed loop active gate driver using an oscilloscope.

FIG. 3 shows a closed loop AGD using an oscilloscope 302 to measure electrical signals from a MOSFET 106. A computer (PC) can then perform power analysis on the electrical signals and adapt the driving pattern for the AGD 104 in real time. However, it is not feasible to use an oscilloscope and a PC in practice as they are generally large pieces of equipment.

The methods for addressing the variation in power semiconductors discussed above, in relation to FIGS. 2 and 3, are not feasible or applicable in real operation due to the need to use additional equipment or high requirement sensing circuits. Additionally, these methods require many hardware modifications when adapting from one model of power semiconductor to another model.

Figure 4:
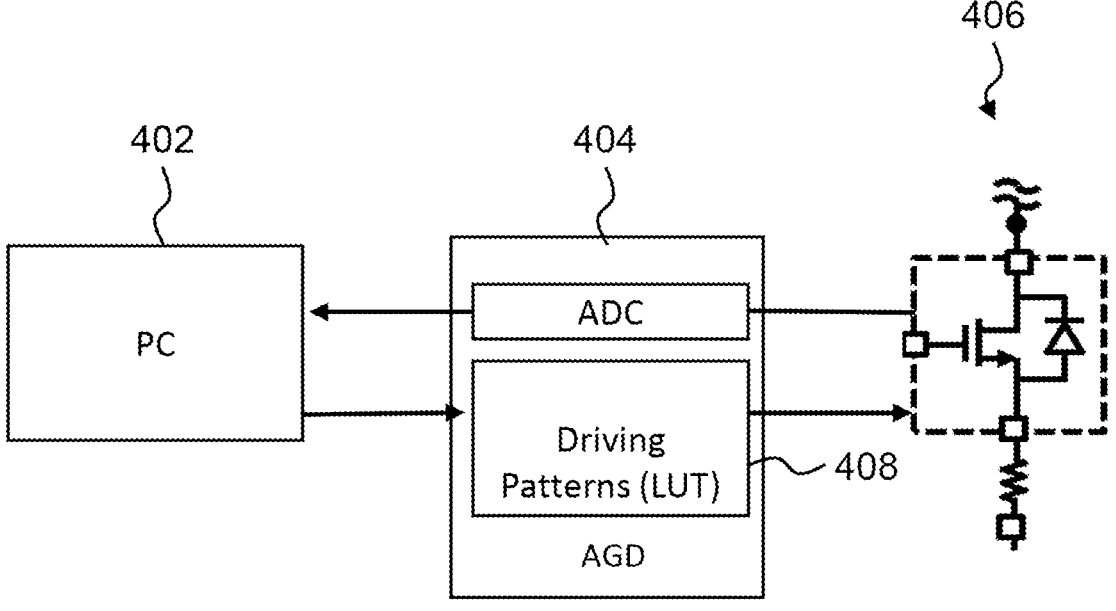
FIGS. 4 and 5 illustrate a proposed method for developing driving patterns and selecting a driving pattern for a power semiconductor with an active gate driver.
Figure 5:
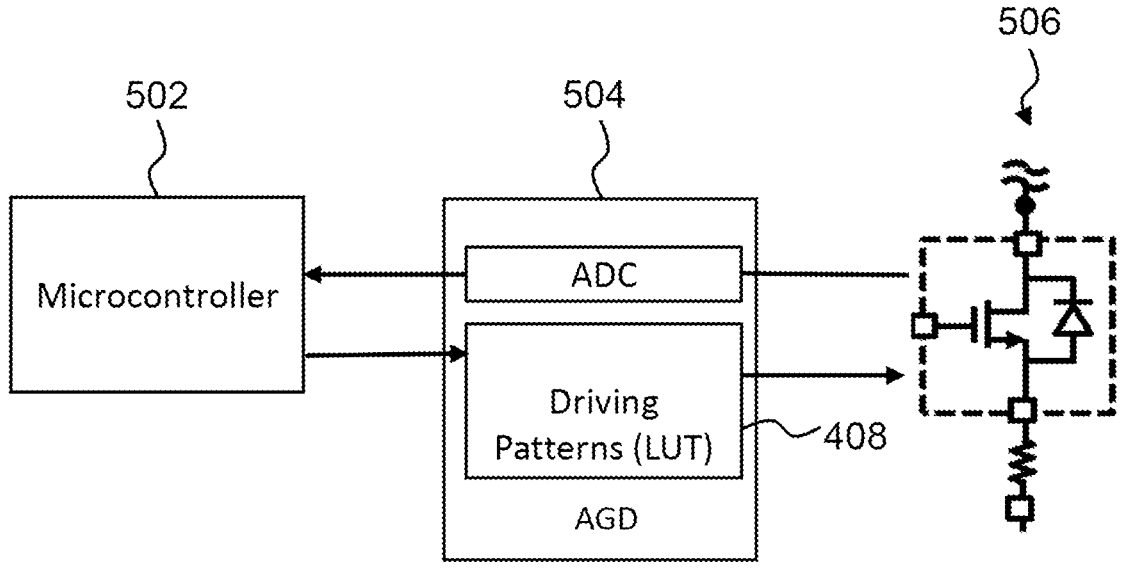

FIGS. 4 and 5 illustrate a method of an embodiment for switching a power semiconductor with an AGD using a closed loop and a pre-developed compensation rule.

FIG. 4 illustrates a method of generating driving patterns 408 for a power semiconductor 406. A variation compensation rule has been developed in the PC based on theoretical modelling or machine learning based method. According to the rule, driving signals are generated under variations of the power semiconductor.

When the theoretical analysis is chosen, a mathematical model is built for the power semiconductor 406 and the relationship between a variation index and the variations is derived.

When a machine learning method is chosen, the computer (PC) 402 controls the AGD 404 to switch the power semiconductor 406 using a reference driving pattern for a plurality of operating conditions. For each operating condition, a driving pattern can be generated with improved switching performance.

This results in a plurality of driving patterns, each with corresponding variation, which are stored for later use. Or the compensation rule to tune the driving patterns with corresponding variation.

The driving patterns can be stored in a memory (e.g., in a look-up table). This method can be performed during a computer-implemented development stage. An algorithm may also be developed which contains compensating rules which specify which driving pattern should be used according to the variations in the power semiconductor, or how to further tune the selected driving pattern if necessary.

FIG. 5 illustrates a method of using the generated driving patterns 408. The microcontroller 502 controls the AGD 504 to switch the power semiconductor 506 based on one of the driving patterns 408. One or more electrical characteristics of the power semiconductor 506 are then obtained, during use. The microcontroller 502 can then select a different driving pattern from the set of pre-determined driving patterns 408 based on the detected variations in key parameters of the power semiconductor. Or the selected driving pattern can be further tuned if necessary.

Both the proposed AGD and the methods mentioned above are suitable for a plurality of power semiconductors. FIG. 4 is the computer-implemented development method. FIG. 5 shows the controller-implemented system in real operation (i.e., in-use). Both the development method and in-use operation show the procedure of how to adapt the AGD and the algorithm from one model of power semiconductor to another model.

In the development stage, a computer is used to provide flexibility whilst developing the driving patterns such that, in the in-use operation, the computer, or any manual interference, does not need to be used. This can bring benefits in the commercialised user end cases as, for example, a microcontroller can be used to select the driving pattern.

In the methods illustrated in FIGS. 4 and 5, minimal on and off-chip hardware is needed, which makes a conventional design easy to adapt. No intricate switching details from the power semiconductor is need which gives design flexibility of the ADC.

When developing driving patterns for different models of power semiconductor, there is no hardware modification needed as the LUT can be updated with generated driving patterns. Thus, the methods described above can be adapted for different power semiconductor models/types by redeveloping the algorithm and the driving patterns. This means the practical design can stay the same for different power semiconductor models/types.

The communication between the active gate driver and the computer, or the controller, can be a serial peripheral interface (SPI), inter-integrated circuit (I2C) or others as long as it suits for the data transferring requirements.

Figure 6:
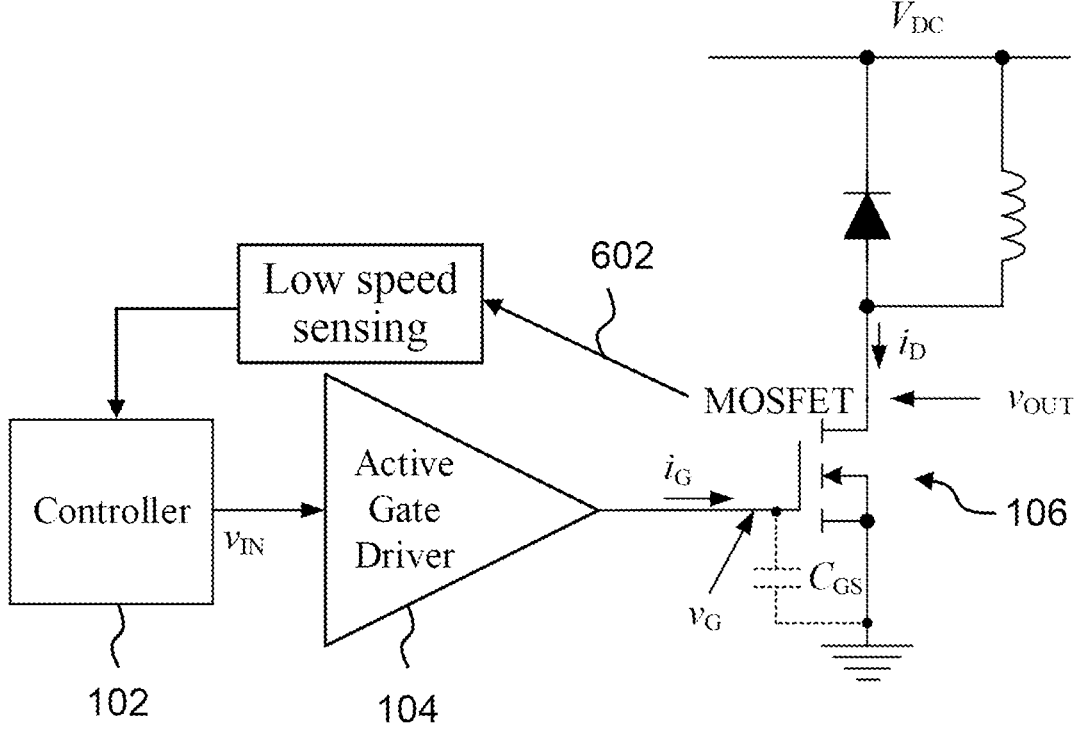
FIG. 6 shows a closed loop active gate driver according to an embodiment.

FIG. 6 shows a closed loop AGD according to an embodiment. The controller 102 controls an AGD 104 to switch a MOSFET 106. The variation indices (i.e., electrical signals) of the MOSFET 106 are then measured via line 602 and fed back to the controller 102. The variation of the MOSFET 106 can then be detected from the measured variation index and the controller can thus select a new driving pattern for the MOSFET 106.

Compared to the open loop AGD in FIG. 1, this closed loop circuit can compensate for the variations of the MOSFET 106 that conventional open loop AGDs cannot, while ensuring good switching performance. Similarly, compared to other feedback/close loop AGDs, such as the ones shown in FIGS. 2 and 3, this closed loop AGD is more easily adaptable from one model of power semiconductor to another model with minimal effort needed. Additionally, in real operation, this closed loop AGD doesn't require additional equipment or a high-speed sensing circuit, nor does it require continuous feedback, manual interference and intricate switching details to compensate for the variations.

Additionally, minimal on-chip and off-chip hardware is needed, which also makes conventional design easy to adapt to. The proposed algorithm can be applied to different power semiconductors, where only the AGD needs to be configured to adapt to one model of power semiconductor. Once the AGD has finished the configuration during development, a LUT can be stored in the active gate driver and can stay constant for the real operation.

In this case, only the variation index needs to be measured during use, not the whole switching transient. This also provides the benefits of relative speed of ADC whilst giving enough information to the algorithm to populate the look up table during development and also selecting the LUT during real operation.

The proposed development method enables the power semiconductor to be switched based on one of a plurality of driving patterns. By adapting the driving pattern based on the current electrical characteristic(s) of the power semiconductor, the controller can compensate for the variations in the power semiconductor while ensuring good performance. It is also advantageous for industrial implementation and adaption.

Another advantage is that the development of the driving patterns can be performed during the development of the AGD, whilst the variation detection and compensation can be performed during use.

The development stage is for configuring the AGD by generating driving patterns for certain electrical characteristic(s) of a particular model of power semiconductor. This occurs before the use of the AGD (e.g., before shipment of AGD to a customer).

The in-use operation is for selecting an appropriate driving pattern based on the variation detected. This may occur in a preliminary test of the system, or during use of the system.

Figure 7:
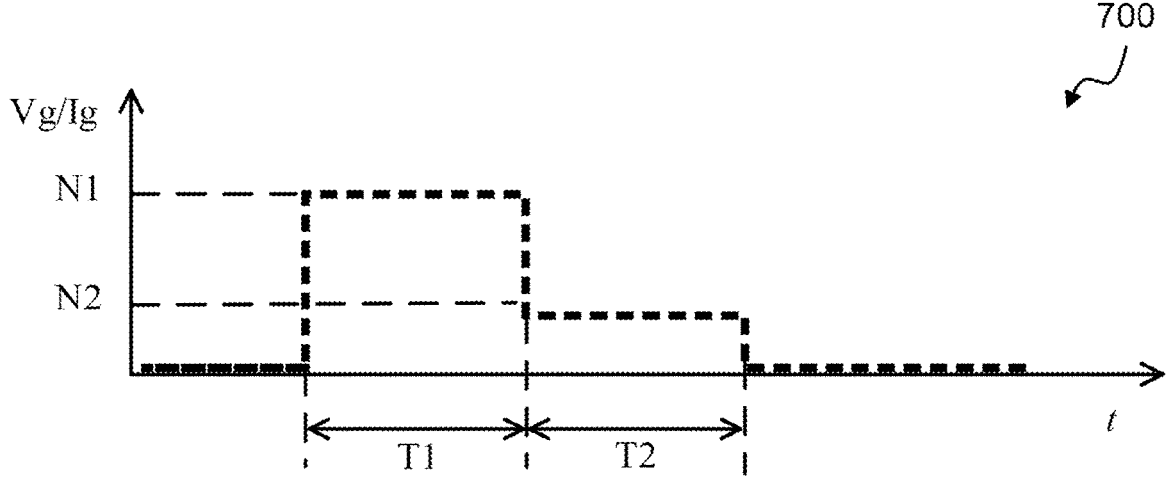
FIGS. 7, 8 and 9 show three driving patterns examples.
Figure 8:
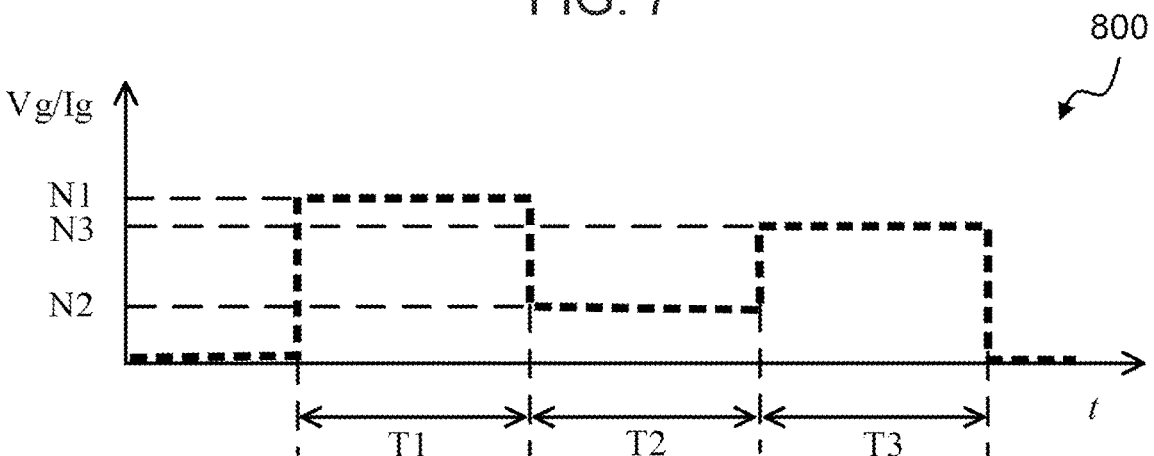
Figure 9:
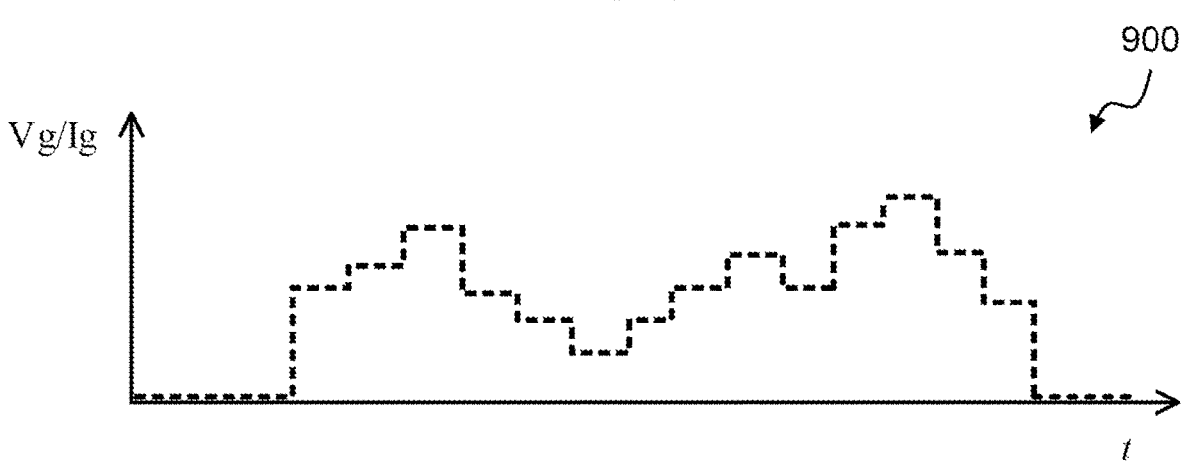

FIGS. 7, 8 and 9 show three driving patterns. FIG. 7 shows a driving pattern 700 with two steps. FIG. 8 shows a driving pattern 800 with three steps. FIG. 9 shows a driving pattern 900 with n steps. Each driving pattern is shown with the gate voltage divided by the gate current on the y-axis and time on the x axis.

As shown in FIGS. 7, 8 and 9, a driving pattern can be a two-step, three-step or n-step driving pattern to adapt to different requirement and complexity of the system. A two-step driving pattern has a parameter vector of [N1, T1, N2, T2], where N1 and N2 are gate voltage over gate current values and T1 and T2 are the timings for each step. A three-step driving pattern has a parameter vector of [N1, T1, N2, T2, N3, T3]. An n-step driving pattern has a parameter vector of [N1, T1, . . . , Nn, Tn].

All the driving patterns can be stored in a LUT to be selected. However, depending on the memory type of the LUT, volatile or non-volatile, the controller can function as the interchange storage of these driving patterns. Moreover, the controller can assist the LUT when the changes in the parameter vector are minimal (e.g., only one driving parameter changes). For example, when only one parameter (e.g., T1) in a three-step driving pattern [N1, T1, N2, T2, N3, T3] needs to be changed to compensate for the variations, the new driving pattern should be [N1, T1new, N2, T2, N3, T3]. In this case, there may be no need to store this driving pattern in the lookup table as, during use, the controller could identify the variation, modify the original driving pattern and generate the new driving pattern [N1, T1new, N2, T2, N3, T3] in real time to drive the power semiconductor as changing only a single driving parameter may not require relatively high computational resources. Thus, the amount of memory available can be used more effectively compared to, for example, storing all possible driving patterns.

Figure 10:
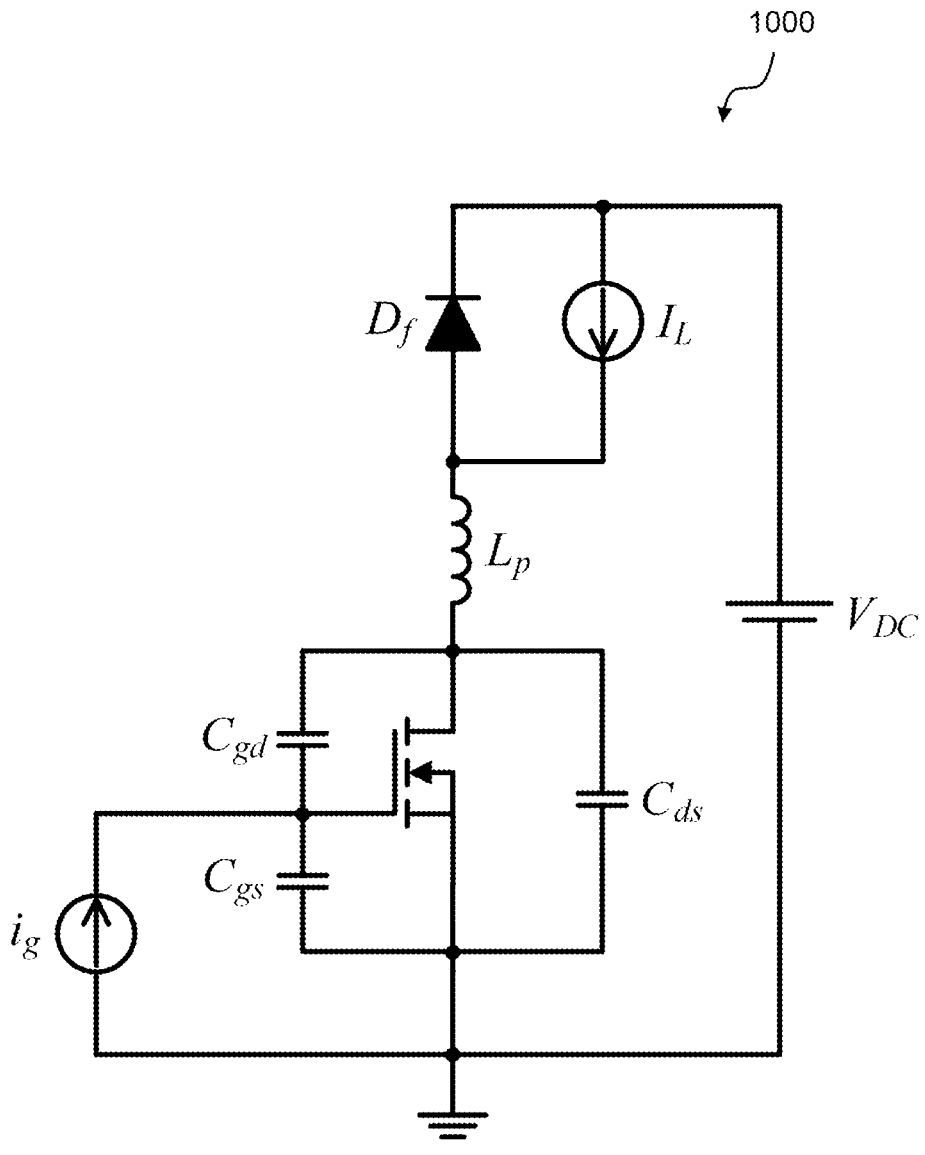
FIG. 10 shows a circuit diagram of a MOSFET in series with a diode.
Figure 11:
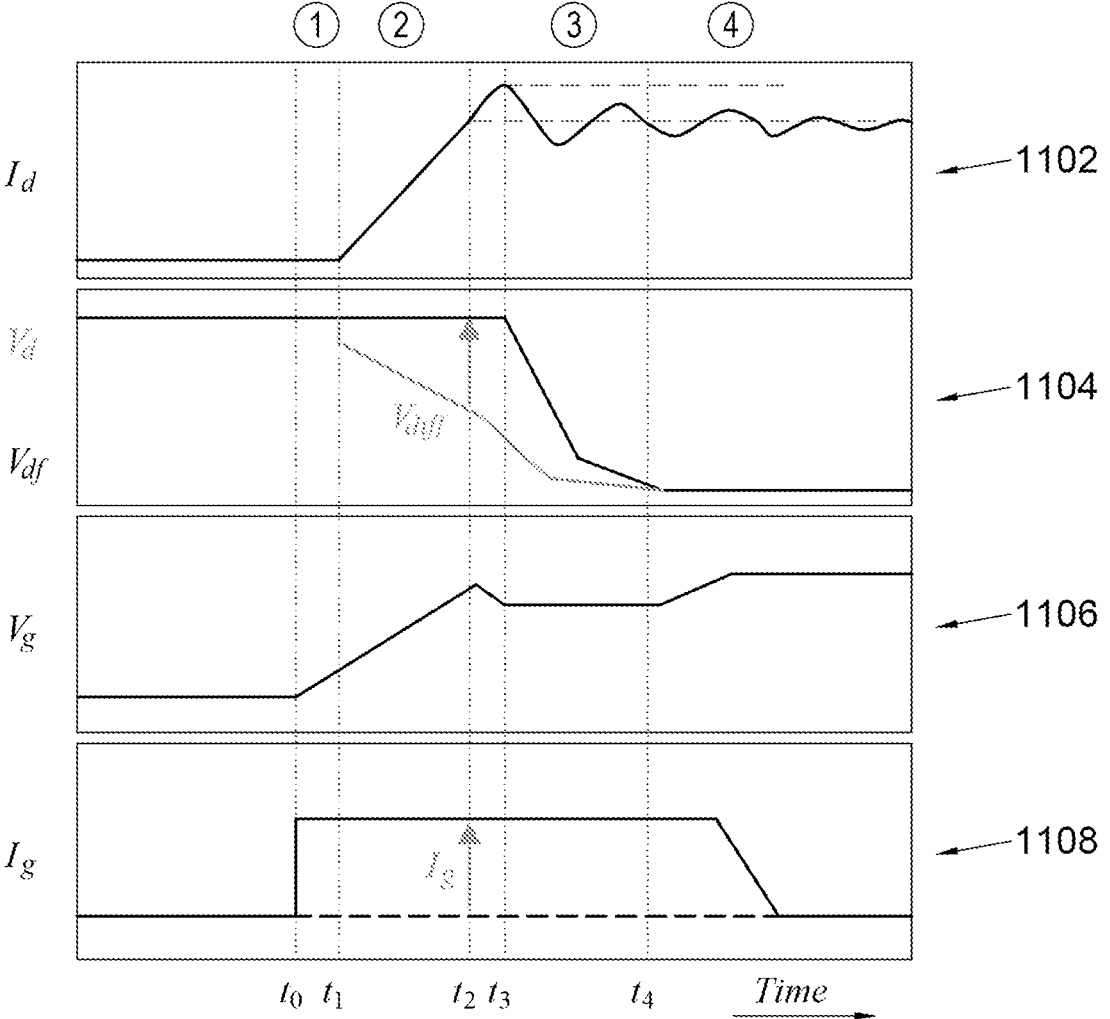
FIG. 11 shows key switching waveforms of a MOSFET.

FIG. 10 shows a circuit diagram 1000 of a MOSFET in series with a diode. FIG. 11 shows key switching waveforms of a MOSFET. In particular, graph 1102 shows the change in drain current over time; graph 1104 shows the change in drain voltage and diode voltage over time; graph 1106 shows the change in gate voltage over time; and graph 1108 shows the change in gate current over time.

Compensation of the threshold voltage $V_{th}$ variation in the MOSFET TK31V60X using AGD driving patterns is given here as an example. The circuit diagram 1000 of FIG. 10 is the equivalent switching circuit of said MOSFET in series with a diode. $V_{DC}$ is the DC voltage, $L_p$ is the parasitic inductance in the circuit, $I_L$ is a load current, $i_g$ represents the output of AGD and $C_{gd}$, $C_{gs}$ and $C_{ds}$ are the parasitic capacitances of MOSFET.

As shown in FIG. 11, t0-t1 is the turn-on delay time. It is defined as the time between when AGD starts to output current until the gate voltage $V_g$ reaches $V_{th}$, and thus the drain current $I_d$ starts to flow. In this region, the MOSFET is in the cut-off region where $V_g < V_{th}$. Thus:

$$v_{gs} = \frac{1}{C_{iss}} \int_0^\tau i_g \cdot dt = \frac{1}{C_{gs} + C_{gd}} \int_{t_0}^{\tau_1} i_g \cdot dt$$

The gate current $i_g$ is fixed as $i_{g0}$ between $t_0$ and $t_1$, so:

$$t_1 - t_0 = \frac{(C_{gs} + C_{gd})V_{th}}{I_{g0}}$$

According to the datasheet of TK31V60X, take $V_{th}$=3V, $C_{gs}$+$C_{gd}$=3000 pF, $I_{g0}$=3 A, which gives $t_1$=3 ns. Considering the $V_{th}$ variation, take $V_{th}$=4.5V (50% shift to the right), $C_{gs}$+$C_{gd}$=3000 pF, $I_{g0}$=3 A, gives new $t_1$=4.5 ns.

For this case, a 3-step driving pattern [N1, T1, N2, T2, N3, T3] can be applied to TK31V60X. After the detection of the change in the turn-on delay time caused by the variation in the threshold voltage $V_{th}$, a new driving pattern can be generated as [N1, T1new, N2, T2, N3, T3] where T1new=T1+(4.5 ns–3 ns)=T1+1.5 ns~T1+2 ns.

Thus, after detecting the variation in the turn-on delay time, a new driving pattern is generated by tuning T1 to T1new, and thus compensating for the variations of $V_{th}$.

The newly generated driving pattern thus corresponds to the measured turn-on delay. As such, in use, the turn on delay can be measured as the time between the gate voltage being output by the AGD, $t_0$, and the drain current beginning to flow, $t_1$, as shown in FIG. 11.

Of course, it will be appreciated that any driving parameter of the driving patterns could be adapted/changed depending on the particular use case and the variation which is detected.

In the examples given above, a MOSFET was used as the power semiconductor. However, it will be appreciated that other types of power semiconductors could also be used for the examples provided above.

The methods described herein can be used for power electronics converters, (i.e. power factor correction (PFC), DC to DC converters etc.), motor drives used in electric vehicles, renewable energy systems, power grids, industrial applications etc.

It will be appreciated that any method described herein can be computer-implemented. A computer-implemented method can be implemented with the use of a processor and/or a controller. Moreover, the steps of any method described herein can be performed by one or more processors and/or one or more controllers.

All methods described herein may control a power semiconductor using an AGD to drive a load.

Implementations of the subject matter and the operations described in this specification can be realized in digital electronic circuitry, or in computer software, firmware, or hardware, including the structures disclosed in this specification and their structural equivalents, or in combinations of one or more of them. Implementations of the subject matter described in this specification can be realized using one or more computer programs, i.e., one or more modules of computer program instructions, encoded on computer storage medium for execution by, or to control the operation of, data processing apparatus. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

While certain embodiments have been described, these embodiments have been presented by way of example only and are not intended to limit the scope of the invention. Indeed, the novel methods, devices and systems described herein may be embodied in a variety of forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

The invention claimed is:

1. A method, comprising:
controlling a power semiconductor, at a plurality of operating conditions, with an active gate driver, AGD;
for an operating condition of the operating conditions:
obtaining one or more electrical signals of the power semiconductor;
detecting a variation in one or more key parameters of the power semiconductor from the one or more electrical signals; and
generating a driving pattern for the AGD, corresponding to the variation in the one or more key parameters, based on a pre-determined relationship between the variation in the one or more key parameters and one or more driving parameters of the driving pattern;
storing generated driving patterns for the operating conditions and corresponding variations in the one or more key parameters in a memory, the driving pattern for the AGD being included in the generated driving patterns for the AGD; and
selecting an appropriate driving pattern from the generated driving patterns in the memory based on an electrical characteristic of the power semiconductor.

2. The method of claim 1, further comprising:
for the operating condition:
determining a number of driving parameters of the generated driving pattern which differ from corresponding driving parameters of a reference driving pattern; and
determining whether the number of driving parameters which differ from the corresponding driving parameters of the reference driving pattern is larger than a threshold number,
wherein a driving pattern of the generated driving patterns is stored if the number of driving parameters of the driving pattern which differ from the corresponding driving parameters of the reference driving pattern is larger than the threshold number.

3. The method of claim 1, wherein one of the key parameters includes a turn-on delay time, and wherein generating the driving pattern includes adapting one or more step timings of a reference driving pattern to generate the driving pattern.

4. The method of claim 3, wherein the electrical signals include a gate voltage waveform and a drain current waveform, wherein the turn-on delay time is a time between when the AGD starts to output voltage and when the drain current starts to flow.

5. The method of claim 1, wherein the plurality of operating conditions include at least one of a plurality of operating voltages or a plurality of operating temperatures.

6. The method of claim 1, comprising selecting the appropriate driving pattern from the generated driving patterns in the memory based on the variation in the one or more key parameters.

7. A method, comprising:
controlling a plurality of power semiconductors of a same model with an active gate driver, AGD;
for a power semiconductor of the power semiconductors:
obtaining one or more electrical signals of the power semiconductor;
detecting a variation in one or more key parameters of the power semiconductor from the one or more electrical signals; and
generating a driving pattern for the AGD, corresponding to the variation in the one or more key parameters, based on a pre-determined relationship between the variation in the one or more key parameters and one or more driving parameters of the driving pattern;
storing generated driving patterns for the power semiconductors and corresponding variations in the one or more key parameters in a memory, the driving pattern for the AGD being included in the generated driving patterns for the AGD; and
selecting an appropriate driving pattern from the generated driving patterns in the memory based on an electrical characteristic of the power semiconductor.

8. The method of claim 7, further comprising:
for the power semiconductor:
determining a number of driving parameters of the generated driving pattern which differ from corresponding driving parameters of a reference driving pattern; and determining whether the number of driving parameters which differ from the corresponding driving parameters of the reference driving pattern is larger than a threshold number, wherein a driving pattern of the generated driving patterns is stored if the number of driving parameters of the driving pattern which differ from the corresponding driving parameters of the reference driving pattern is larger than the threshold number.

9. The method of claim 7, wherein one of the one or more key parameters includes a turn-on delay time, and wherein generating the driving pattern includes adapting one or more step timings of a reference driving pattern to generate the driving pattern.

10. The method of claim 9, wherein the electrical signals include a gate voltage waveform and a drain current waveform, wherein the turn-on delay time is a time between when the AGD starts to output voltage and when the drain current starts to flow.

11. A method for controlling an active gate driver, AGD, comprising:

controlling a power semiconductor with the AGD using a first driving pattern, from a plurality of pre-determined driving patterns, wherein the pre-determined driving patterns correspond to variations in one or more key parameters of the power semiconductor;

obtaining one or more electrical signals of the power semiconductor;

detecting a variation in one or more key parameters of the power semiconductor based on the electrical signals;

selecting a second driving pattern, from the plurality of pre-determined driving patterns, corresponding to the detected variation in the one or more key parameters; and controlling the power semiconductor with the AGD using the second driving pattern.

12. The method of claim 11, further comprising:

determining a number of driving parameters of the first driving pattern to be adapted based on the variation in the one or more key parameters, wherein selecting the second driving pattern from the plurality of pre-determined driving patterns is based on the number of driving parameters being above a threshold number, and wherein the method further comprises, based on the number of driving parameters being below, or equal to, the threshold number, adapting the first driving pattern based on the variation in the one or more key parameters to generate the second driving pattern.

13. The method of claim 11, wherein one of the one or more key parameters includes a turn-on delay time.

14. The method of claim 13, wherein the electrical signals include a gate voltage waveform and a drain current waveform, wherein the turn-on delay time is between when the AGD starts to output voltage and a time when the drain current starts to flow.

15. The method of claim 11, further comprising obtaining a plurality of driving patterns by generating a driving pattern, for an operating condition, corresponding to the variation in the one or more key parameters, based on a pre-determined relationship between the variation in the one or more key parameters and one or more driving parameters of the driving pattern.

16. A non-transitory computer medium comprising a computer program comprising computer program code which, when executed on a processing device, causes the processing device to perform the steps of:

controlling a power semiconductor, at a plurality of operating conditions, with an active gate driver, AGD;

for an operating condition of the operating conditions:

obtaining one or more electrical signals of the power semiconductor;

detecting a variation in one or more key parameters of the power semiconductor from the one or more electrical signals; and generating a driving pattern for the AGD, corresponding to the variation in the one or more key parameters, based on a pre-determined relationship between the variation in the one or more key parameters and one or more driving parameters of the driving pattern; and storing generated driving patterns for the operating conditions and corresponding variations in the one or more key parameters in a memory, the driving pattern for the AGD being included in the generated driving patterns for the AGD; and selecting an appropriate driving pattern from the generated driving patterns in the memory based on an electrical characteristic of the power semiconductor.

17. A system, comprising:

an active gate driver, AGD;

a power semiconductor;

a memory; and a controller configured to:

control the power semiconductor, at a plurality of operating conditions, with the AGD;

for an operating condition of the operating conditions:

obtain one or more electrical signals of the power semiconductor;

detect a variation in one or more key parameters of the power semiconductor from the one or more electrical signals; and generate a driving pattern for the AGD, corresponding to the variation in the one or more key parameters, based on a pre-determined relationship between the variation in the one or more key parameters and one or more driving parameters of the driving pattern;

store generated driving patterns for the operating conditions and corresponding variations in the one or more key parameters in the memory, the driving pattern for the AGD being included in the generated driving patterns for the AGD: and select an appropriate driving pattern from the generated driving patterns in the memory based on an electrical characteristic of the power semiconductor.

18. A system, comprising:

an active gate driver, AGD;

a plurality of power semiconductors;

a memory; and a controller configured to:

control a plurality of power semiconductors of a same model with the AGD;

for a power semiconductor of the power semiconductors:

obtain one or more electrical signals of the power semiconductor;

detect a variation in one or more key parameters of the power semiconductor from the one or more electrical signals; and generate a driving pattern for the AGD, corresponding to the variation in the one or more key parameters, based on a pre-determined relationship between the variation in the one or more key parameters and one or more driving parameters of the driving pattern;

store generated driving patterns for the power semiconductors and corresponding variations in the one or more key parameters in the memory, the driving pattern for the AGD being included in the generated driving patterns for the AGD; and select an appropriate driving pattern from the generated driving patterns in the memory based on an electrical characteristic of the power semiconductor.

19. A system for controlling an active gate driver, AGD, comprising:

an AGD;

a power semiconductor;

a memory storing a plurality of pre-determined driving patterns, wherein each pre-determined driving pattern corresponds to a variation in one or more key parameters of the power semiconductor; and a controller configured to:

control the power semiconductor with the AGD using a first driving pattern, from the plurality of pre-determined driving patterns;

obtain electrical signals of the power semiconductor;

detect a variation in the one or more key parameters of the power semiconductor based on the electrical signals;

select a second driving pattern, from the plurality of pre-determined driving patterns, corresponding to the variation in the one or more key parameters; and control the power semiconductor with the AGD using the second driving parameter.

* * * * *